(12) United States Patent
Dike

(10) Patent No.: US 6,654,944 B1
(45) Date of Patent: Nov. 25, 2003

(54) TWO-DIMENSIONAL C-ELEMENT ARRAY

(75) Inventor: Charles E. Dike, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/183,664

(22) Filed: Jun. 28, 2002

(51) Int. Cl.[7] .............................................. G06F 17/50
(52) U.S. Cl. ..................... 716/17; 326/38; 326/39; 716/1
(58) Field of Search ...................... 716/1, 17; 326/93, 326/38, 39

(56) References Cited

U.S. PATENT DOCUMENTS

| | | | | |
|---|---|---|---|---|
| 4,688,947 A | * | 8/1987 | Blaes et al. .................. 368/120 |
| 4,700,187 A | * | 10/1987 | Furtek .......................... 326/39 |
| 4,918,440 A | * | 4/1990 | Furtek .......................... 326/37 |
| 5,646,554 A | | 7/1997 | Kim et al. ..................... 326/93 |
| 5,724,562 A | | 3/1998 | Ishiwaki et al. ............... 326/93 |
| 6,486,700 B1 | * | 11/2002 | Fairbanks et al. ............ 326/36 |

OTHER PUBLICATIONS

Santos et al.,"ACMOS Delay Locked Loop and Sub–Nano-second Time–toDigital Converter Chip", Oct. 1995, IEEE Nuclear Science Symposium and Medical Imaging Conference Record, vol. 1, pp 289–291.*

Yoshikawa et al.,"20Gb/s Self–timed Vector Processing with Josephson Single–flux Quantum Technology", Feb. 1997, IEEE 44 International Solid–State Circuits Conference, Digest of Technical Papers, pp. 128–129, 441.*

* cited by examiner

Primary Examiner—Leigh M. Garbowski
Assistant Examiner—Sun James Lin
(74) Attorney, Agent, or Firm—Kenyon & Kenyon

(57) ABSTRACT

Embodiments of the present invention include a two-dimensional C-element array that may be configured to propagate a periodic waveform. The two-dimensional C-element array is advantageous in high-speed clocking applications as in, for example, processors in semiconductor chips.

16 Claims, 11 Drawing Sheets

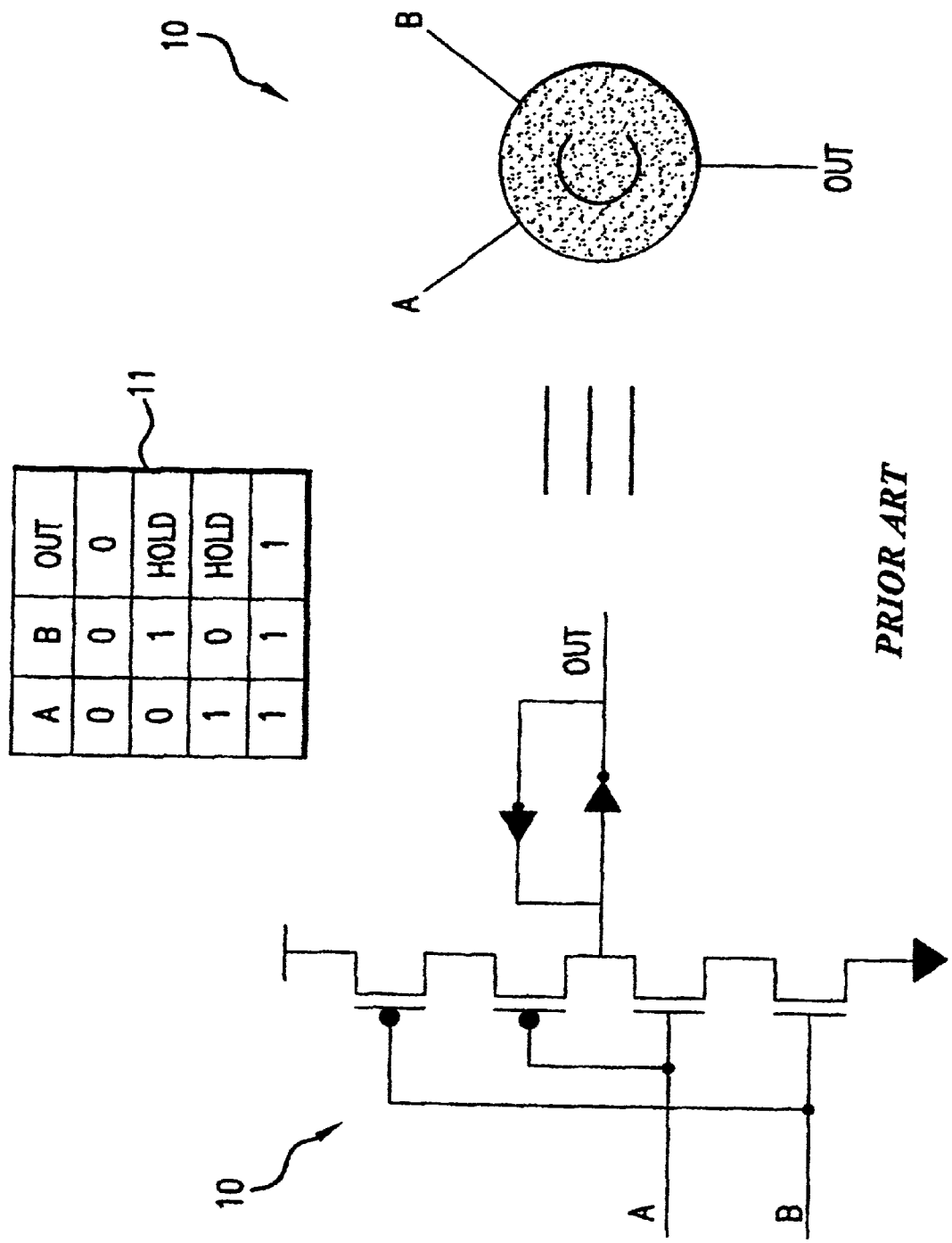
FIG. 1 *PRIOR ART*

```
                C-ELEMENTS 14-
                a b c d e f g h
TRANSITION 1 | 1 0 0 0 0 0 0 0
           2 | 1 1 0 0 0 0 0 0
           3 | 0 1 1 0 0 0 0 0
           4 | 0 0 1 1 0 0 0 0
           5 | 1 0 0 1 1 0 0 0
                LOGIC STATES
```

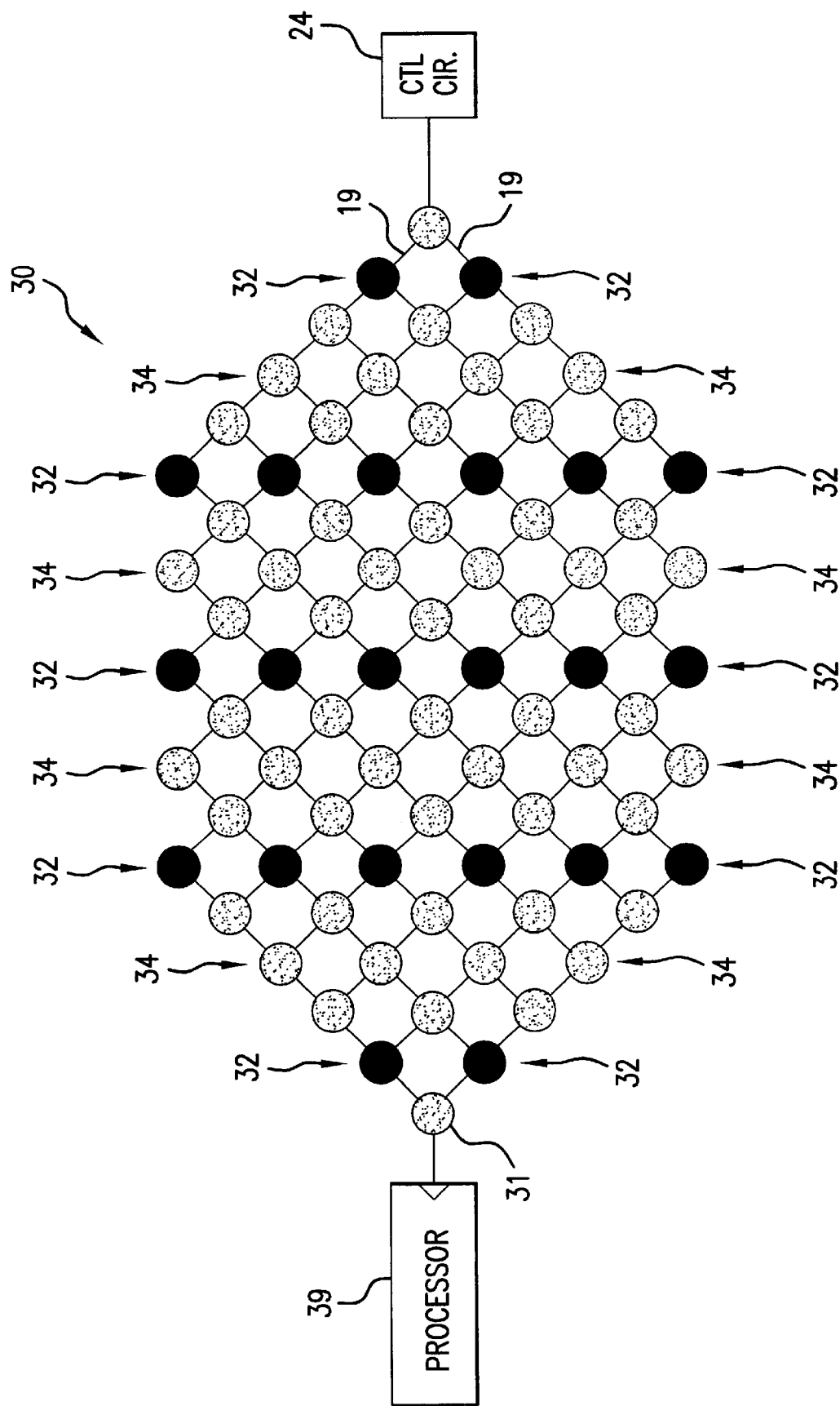

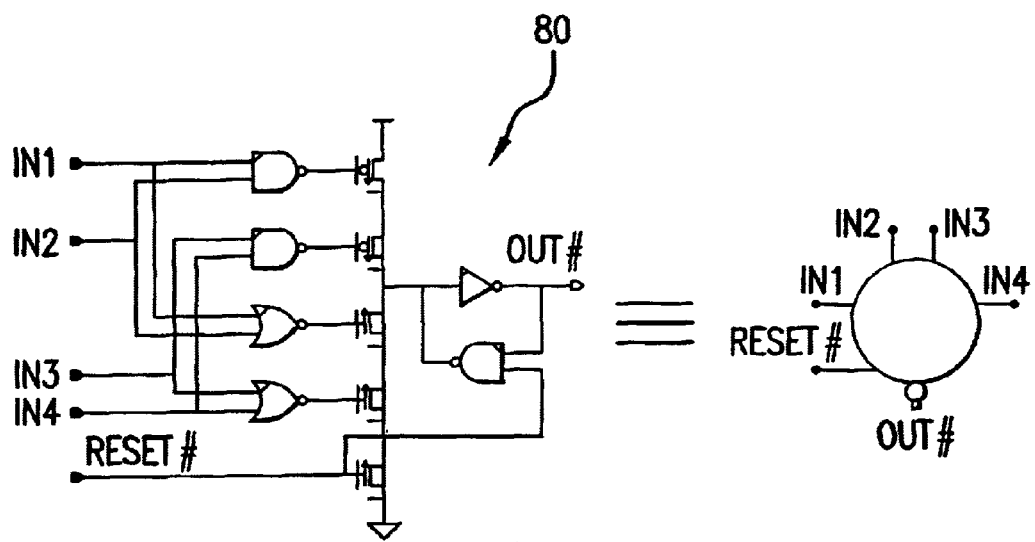
FIG. 8 *PRIOR ART*
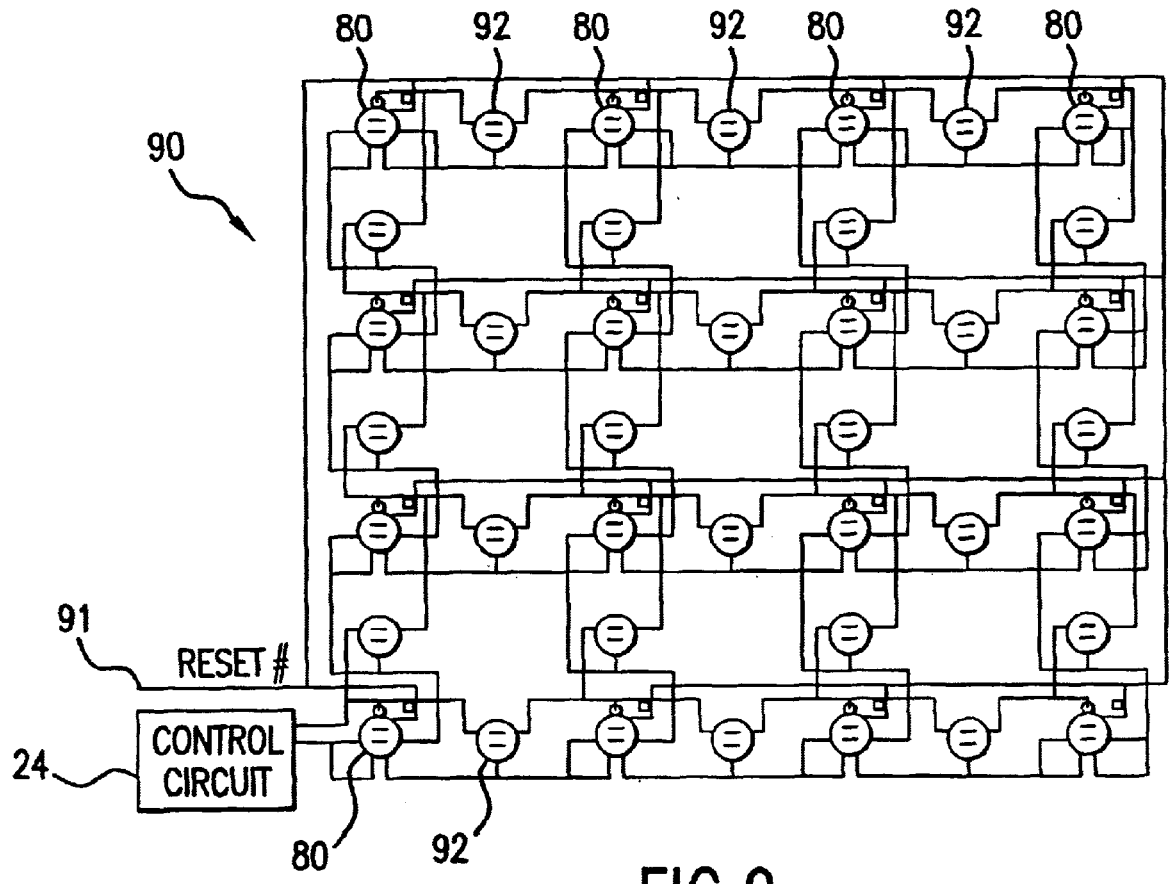
FIG. 9

TWO-DIMENSIONAL C-ELEMENT ARRAY

BACKGROUND OF THE INVENTION

1. Field of the Invention

The present invention relates generally to providing improved clocking in synchronous high-speed semiconductor chips. More particularly, the present invention relates to using the unique properties of a two-dimensional C-element array to provide, among other advantages, source synchronous transfer of data, localized clock sources with frequencies responsive to voltage, temperature, and usage, and reduced power consumption in the chips.

2. Description of the Related Art

Semiconductor devices, also referred to herein as "chips," may comprise digital circuits having components that typically operate in synchronism. "Synchronism" means that, in such devices, clocks may be utilized to synchronize events among digital components such as flip-flops, multiplexers, adders, and multipliers. A clock may generate a series of sequential square pulse signals that transition from a low state (i.e., logic "0") to a high state (i.e., logic "1") and back again in a periodic manner. The series of pulses, also known as a pulse train, may be sent by the clock through conductive lines to each of the digital components to indicate when specific operations must be performed.

Digital circuits are typically triggered by the "active" edge of a clock cycle. The active edge is typically the rising edge of the square wave pulse, although it may sometimes be on the falling edge of the pulse. A digital circuit usually requires its clocked components to be synchronized with active edges of the clock cycles to function properly.

In a typical design today, the clock is generated independently of the data and does not travel in conjunction with data to the data receiver. By contrast, "source synchronous" clocking means that a source device sends clocking information, along with data, to a receiving device.

In a conventional semiconductor chip, the clock is typically driven by a phased-locked loop (PLL), which is a commonly used circuit in modern electronics systems. PLL circuits oscillate to match in phase and lock onto the frequency of an input signal. A PLL circuit may be used for many purposes, such as generating, modulating or demodulating a signal or removing noise from a signal. PLL circuits are also used to recover a clock signal based on an input reference signal.

A conventional PLL circuit includes a voltage-controlled oscillator (VCO) and a phase detector in a feedback loop. The VCO generates an output frequency, which is input to the phase detector. The phase detector then causes the VCO to seek and lock onto the desired frequency, based on the difference between the output of the VCO and the input signal. If a difference exists, the phase detector generates an error voltage that is used to bring the VCO to the correct frequency.

Although PLL circuits have become the standard with which circuits are coordinated with clock pulses, PLL circuits have certain characteristics that limit their effectiveness in clocking applications. For example, analog adjustments in PLL-driven clocking frequency in response to changing circuit conditions such as voltage, temperature and usage are difficult to achieve. Such adjustments are difficult to make, for example, because typically a PLL is only able to detect clocking phase problems at certain checkpoints throughout the chip and respond through a feedback system.

Furthermore, the inability of PLL-driven clock circuits to readily make adjustments in frequency based on changing circuit conditions means that often power is wasted. Since, for example, a low frequency task requires less power than a high frequency task, a PLL-driven clock circuit by design is unable to conserve power when a processor is executing a low frequency task, because usually the clock circuit runs at a fixed, higher frequency.

PLL circuits also have certain limitations that will render them unable to service future generations of chips with much higher clock speeds. Following Moore's Law, which has held true since 1965, the number of transistors on an integrated circuit will double every 18 months. Therefore, by mid-2003, processors may be running at four to five gigahertz. In 2005, it may be possible to attain speeds up to ten gigahertz. As clock speeds increase, chips having clocks driven by PLL circuits will be unable to adjust their frequency to temperature, voltage, and usage variations in an efficient manner.

In view of the above discussion, a system is called for that overcomes the limitations and problems of PLL circuits as described above.

BRIEF DESCRIPTION OF THE DRAWINGS

The present invention will be readily understood by the following detailed description in conjunction with the accompanying drawings. To facilitate this description, like reference numerals designate like structural elements.

FIG. 1 is a diagram of a conventional two-state joining circuit known as a Muller C-element and a state diagram of the Muller C-element;

FIG. 4 illustrates a 2D C-element array in accordance with one embodiment of the present invention;

FIG. 8 is a diagram of a conventional four-state joining circuit known as a Muller C-element with a reset# input and an output inverted from the inputs; and FIG. 9 illustrates another sparse 2D C-element array for a semiconductor chip in accordance with one embodiment of the present invention that includes a reset scheme.

DETAILED DESCRIPTION

According to embodiments of the invention, a system for improved clocking in semiconductor chips is provided.

Embodiments may comprise a two-dimensional C-element array configured to propagate a periodic waveform. The two dimensional C-element array may be arranged in a semiconductor device, for example, and a selected C-element of the array may be used locally as a clock or driver to enable source synchronous operations by logic circuitry of the semiconductor device.

In embodiments, the two-dimensional C-element array may be configured to be "free-running" as described in more detail in the following. When free-running, the array is naturally responsive to voltage and temperature, in contrast to a PLL as described above. Alternatively, the two-dimensional C-element array may be controlled by a control circuit that tracks voltage, temperature and usage. Thus, embodiments of the invention are able to adjust on demand to changing circuit conditions, to provide advantages including reduced power consumption.

FIG. 1 shows a conventional two-state joining circuit 10 known as a Muller C-element. Muller C-element 10 may also be represented by a circle having at least two inputs A and B and an output OUT, as further illustrated in FIG. 1. Also shown is a truth table 11 of Muller C-element 10. As illustrated in truth table 11, the output of C-element circuit 10 becomes high (logic "1") only upon all inputs A and B being high. The output also becomes low (logic "0") only upon all inputs A and B being low. A C-element may have more than two inputs, but is characterized by the behavior described in truth table 11. That is, only when all inputs are logic "0" will the output of a C-element be logic "0", and only when all inputs are logic "1" will the output be logic "1". For all other input combinations, the output of the C-element will hold its previous value.

It may be seen that by inverting the output of C-element 10 and feeding the inverted output back to the inputs, an oscillation will be set up. For example, assume that the output, OUT, initially has a value of logic "0", and that OUT is inverted and connected to inputs A and B. It follows from truth table 11 that OUT will subsequently change to logic "1". Then, because OUT is inverted, the input to A and B will be logic "0" and accordingly OUT will change back to logic "0". Thus, the output of C-element 10 will oscillate back and forth between logic "0" and logic "1", at a rate which depends on characteristics of the C-element (transition speed, length of connections and the like).

Figure 2A:
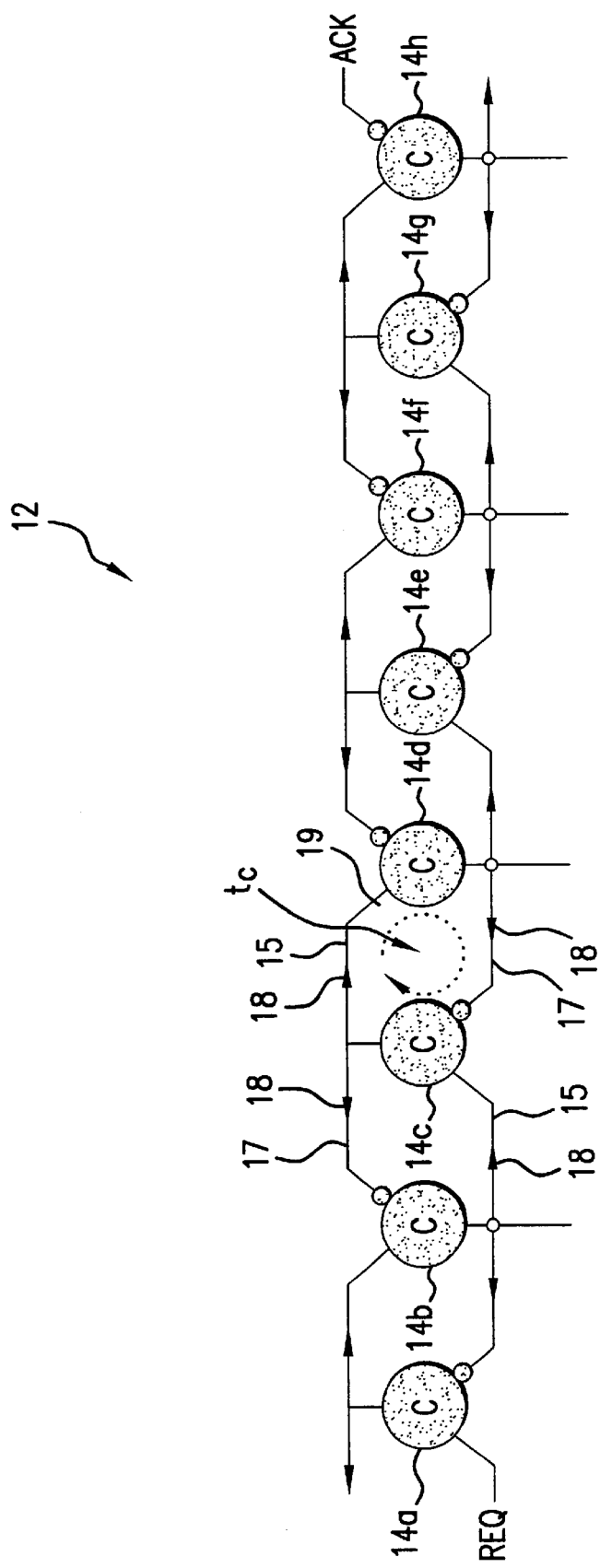
FIG. 2A illustrates a C-element chain in accordance with one embodiment of the present invention.

FIG. 2A illustrates a C-element chain 12 in accordance with one embodiment of the present invention. C-element chain 12 includes a plurality of C-elements 14a–h coupled in series. Each C-element 14 is coupled to at least one other C-element 14 via a non-inverting connector 15 and an inverting connector 17. Directionality of signals propagated along the chain 12, i.e., whether a particular connector carries an input or an output signal to a respective C-element of the chain, is indicated by arrowheads 18. For example, C-element 14c includes a first input that is coupled to the output of C-element 14b by a non-inverting connector 15. C-element 14c also includes a second input that is coupled to the output of C-element 14d by an inverting connector 17. The output of C-element 14c is coupled to an input of C-element 14b by an inverting connector 17 and to an input of C-element 14d by a non-inverting connector 15. C-element 14a includes an input for a request (REQ) signal and C-element 14h includes an inverted input for an acknowledgment (ACK) signal.

C-element chain 12 may function to propagate a signal down the length of the chain. For example, if ACK is low and the outputs of all of C-elements 14 are low when REQ switches from low to high, then the output of C-element 14a will go high. The output value of C-element 14a goes to logic "1" because both inputs, REQ and the inverted output of C-element 14b are high. The output of C-element 14a then starts a chain reaction wherein the outputs of all of the C-elements in succession go high. For example, the output of C-element 14b goes high because both of its inputs, i.e., the non-inverted input from C-element 14a and the inverted input from C-element 14c, are now high. Similarly, because both inputs to C-element 14c, i.e., the non-inverted input from C-element 14b and the inverted input from C-element 14d, are now high, the output of C-element 14c goes high, and so on. At the same time, when the outputs of the C-elements go high, each C-element in turn is "armed" to transition from high to low when the next high to low transition of REQ occurs (this assumes that the ACK has gone high after C-element 14h went high).

Signal propagation time from one C-element to its neighboring C-element may not necessarily be the same for all C-elements, due to differences in the physical properties of the individual component C-elements of the chain 12 and the connectors 15 and 17. That is, each closed electrical loop 19 formed by two neighboring C-elements and their connectors may have a differing delay characteristic $t_C$. For example, the loop formed by C-elements 14c and 14d and their connectors may have a different delay characteristic $t_C$ from a loop formed by C-elements 14d and 14e and their connectors. On the other hand, the delay characteristics of all the loops in the chain 12 could be matched to cause signal propagation time to be substantially equal for all loops.

It may further be seen in view of the discussion above that a chain (which may be viewed as a one-dimensional array) of C-elements interconnected as shown in FIG. 2A can be made to carry an oscillating signal, by introducing feedback. If, for example, the output of C-element 14a is inverted and connected to the REQ input of C-element 14a, and if the inverting ACK input of C-element 14h is connected to its output, a feedback loop will be formed that will cause the array to oscillate at a "natural" frequency, given appropriate initial conditions. The natural frequency is determined by the delay characteristic $t_C$ of the slowest loop in the in array (i.e., the loop with the greatest delay).

Figures 2B, 2C:
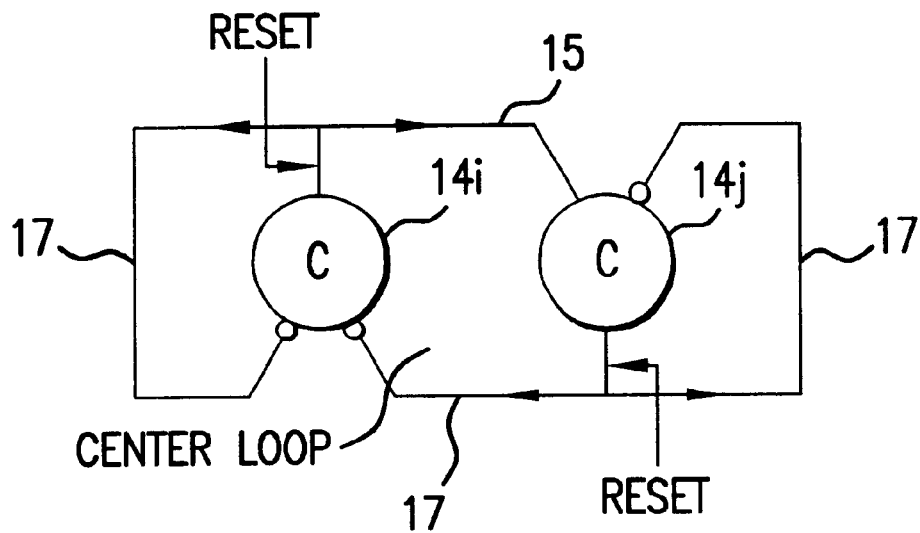
FIG. 2B shows two interconnected C-elements to illustrate oscillation therein.
FIG. 2C shows logic states for state transitions of the C-element chain shown in FIG. 2A.

FIG. 2B illustrates the foregoing principles with a circuit having only two interconnected C-elements, for ease of understanding. In FIG. 2B, a C-element 14i is shown connected to a C-element 14j using inverting and non-inverting connections as discussed in connection with FIG. 2A. The circuit has a reset input connected as shown which may be used to set initial conditions. For example, assume that the reset input outputs a logic "0", forcing the outputs of both 14i and 14j to be low at the same time, and that then the reset input is electrically de-coupled from the circuit (actual implementations of such a reset input could take various forms; one possible implementation is discussed in more detail later).

As a result, C-element 14i now receives two logic "1" values as inputs, while C-element 14j receives a logic "0" and logic "1" value as input. Accordingly, 14j holds its previous value of logic "0" while 14i makes a transition to logic "1". As a result of the transition of 14i, 14j receives two logic "1" values as inputs and accordingly makes a transition to logic "1". As a result, 14i now receives two logic "0" values as inputs and thus makes a transition to logic "0". Thus, 14j now receives two logic "0" values as input and make a transition to logic "0", and so on. An oscillation is thereby set up in the circuit shown in FIG. 2B. Moreover, the natural frequency of the oscillation is determined by the delay characteristic $t_C$ of the slowest loop (in this simple example, the center loop). This can be seen because the speed of transition of each C-element depends on the speed of transition of its neighbor and the propagation delay in the connections to its neighbor. More particularly, a "faster" C-element must wait for "permission," i.e., enabling signals, from its "slower" neighbor in order to make a transition.

FIG. 2C shows logic states of C-elements 14a–14h of chain 12 for five state transitions, assuming feedback as described above, and assuming an initial state in which all the outputs of C-elements 14a–14h are logic "0". By applying an analysis along the lines applied to the two-C-element circuit of FIG. 2B, it may be seen from FIG. 2C that when chain 12 settles into a long-term oscillatory pattern, C-elements 14a and 14e will be in phase with each other and 180° out-of-phase with C-element 14c, C-elements 14b and 14f will be in phase with each and 180° out-of-phase with C-element 14d, and so on. Further, each C-element of chain 12 will oscillate at the natural frequency, which will be determined by the delay characteristic $t_C$ of the slowest loop.

Figure 3A:
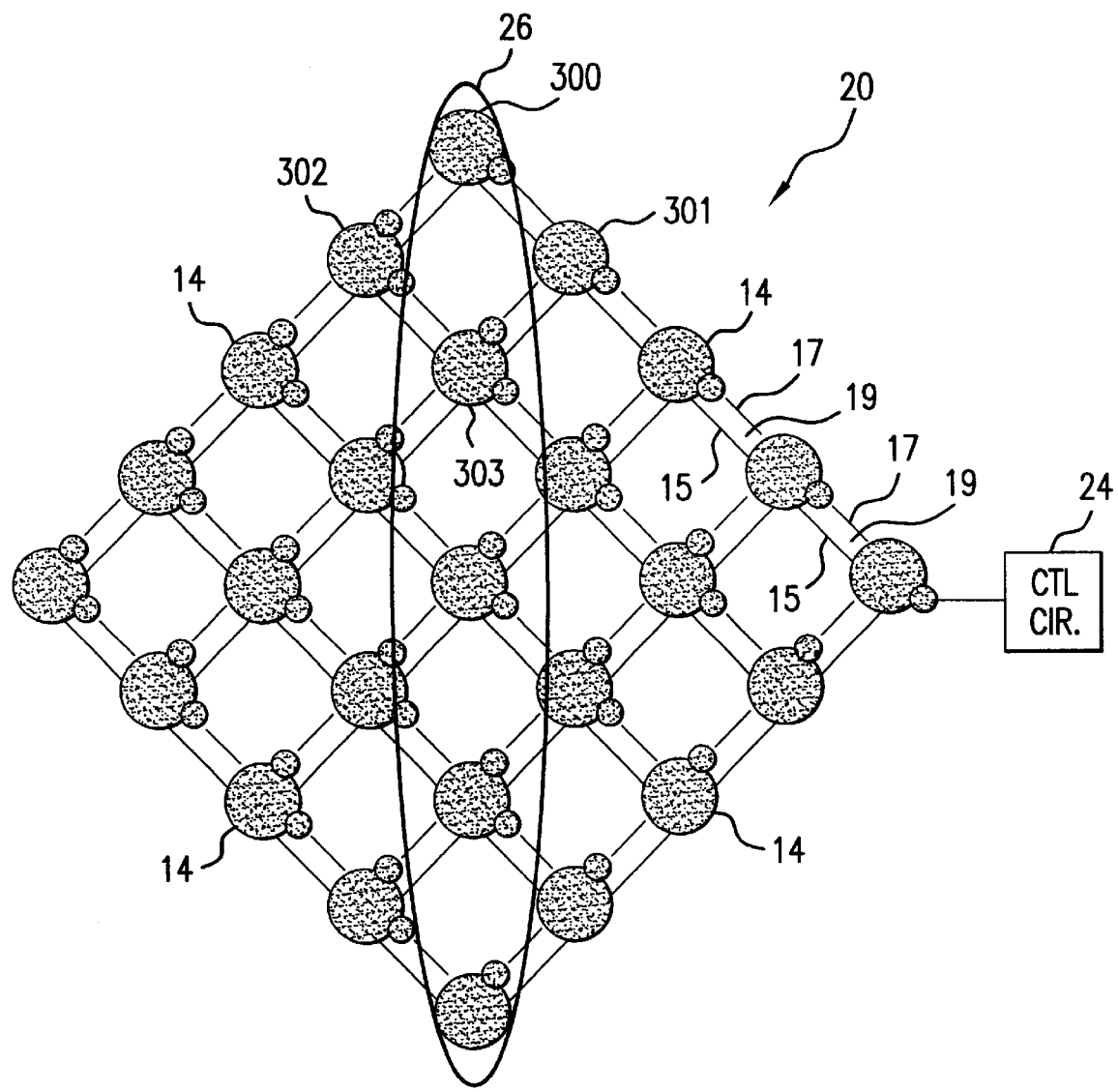
FIG. 3A illustrates a two-dimensional (2D) C-element array in accordance with one embodiment of the present invention.

FIG. 3A illustrates a two-dimensional (2D) C-element array 20 in accordance with one embodiment of the present invention. "Two-dimensional" as used herein means that the constituent C-elements of the array may be arranged so as to form a plurality of columns and rows. Possible configurations of columns and rows according to embodiments are illustrated by broken lines in FIGS. 3B and 3C, discussed hereinafter, but broken lines are omitted from FIG. 3A in order to avoid cluttering the drawing.

As noted above, FIG. 3A illustrates a 2D C-element array 20. Array 20 includes a plurality of C-elements 14 coupled together by inverting connectors 17 and non-inverting connectors 15. An inverting connector 17 connected to a C-element 14 is an input to that C-element. A non-inverting connector 15 connected in parallel to that inverting connector is an output of that C-element. Pairs of C-elements 14 connected by non-inverting connectors 15 and inverting connectors 17 form loops 19.

Given appropriate initial conditions and a period of time to reach a steady state or long-term oscillatory pattern, the C-elements 14 of 2D array 20 may oscillate at a natural frequency determined by the slowest loop of array 20, as described above in connection with FIGS. 2A–2C. When 2D array 20 has settled into a long-term oscillatory pattern, it may be viewed as propagating a periodic waveform. Such a periodic waveform is represented in FIG. 3 by area 26. Area 26 represents all of the five C-elements within area 26 being in phase; i.e., the five C-elements within area 26 take on substantially the same logic value, dictated by the oscillatory pattern, at substantially the same time. To cause an in-phase grouping of aligned C-elements as represented by area 26, each loop 19 formed by the C-elements 14 and their connectors could be matched to have substantially the same delay characteristic $t_C$. On the other hand, if all loops were not matched, array 20 might not necessarily exhibit in-phase groups of aligned C-elements as in area 26. However, even if all loops were not matched, array 20 would still exhibit regular, predictable state transition sequences, since, as described above, the state transitions of each C-element depend on the inputs from its neighbors.

Figure 3B:
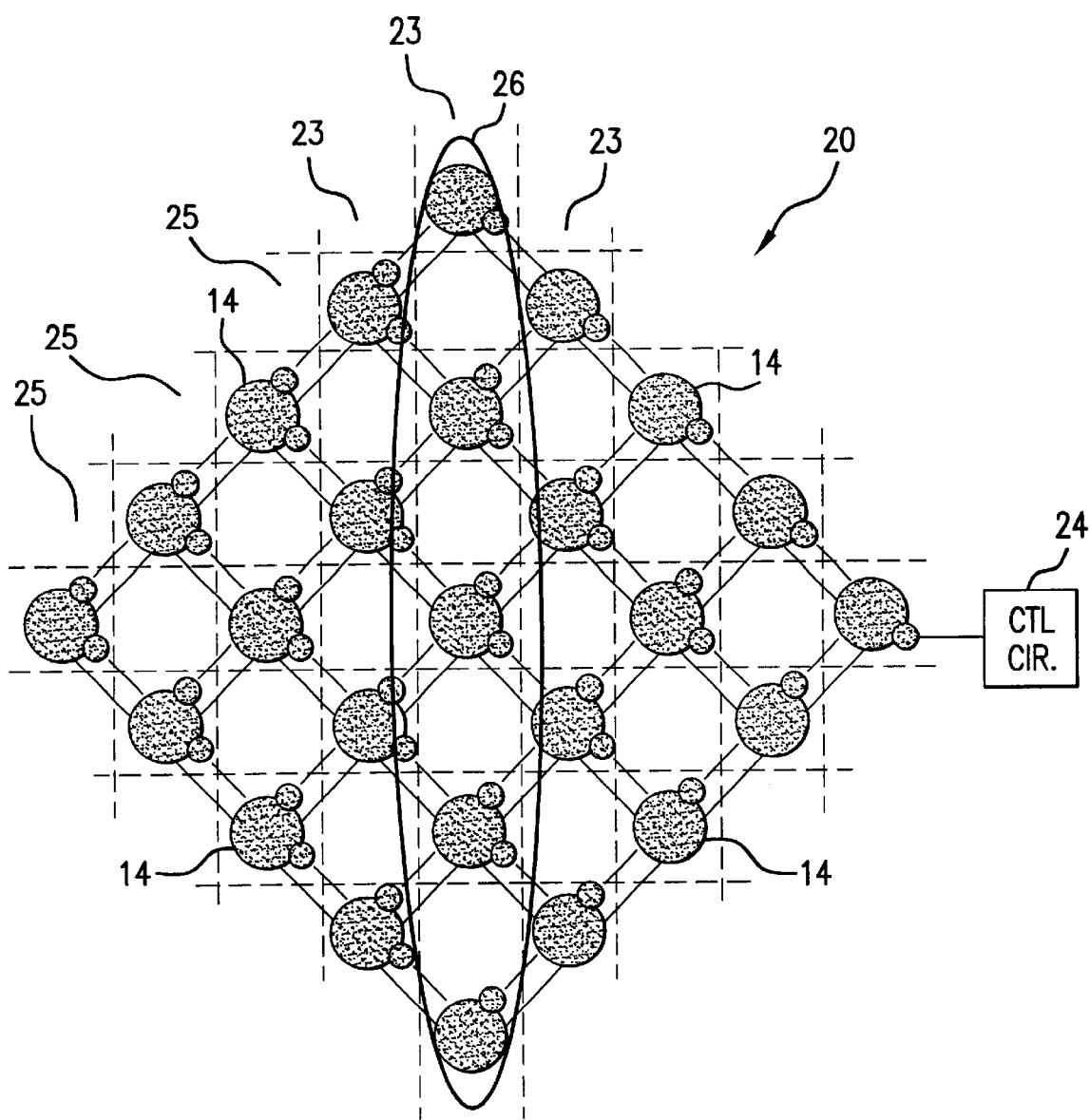
FIGS. 3B and 3C illustrate the 2D C-element array of FIG. 3A with broken lines superimposed thereon to illustrate possible configurations of rows and columns.

FIG. 3B shows the 2D C-element array 20 of FIG. 3A with broken lines superimposed thereon to illustrate one possible description of array 20 in terms of columns 23 and rows 25 (it will be recognized that the designation of which are rows and which are columns is purely arbitrary). In FIG. 3B, the five elements in the central column of array 20 are in phase.

Figure 3C:
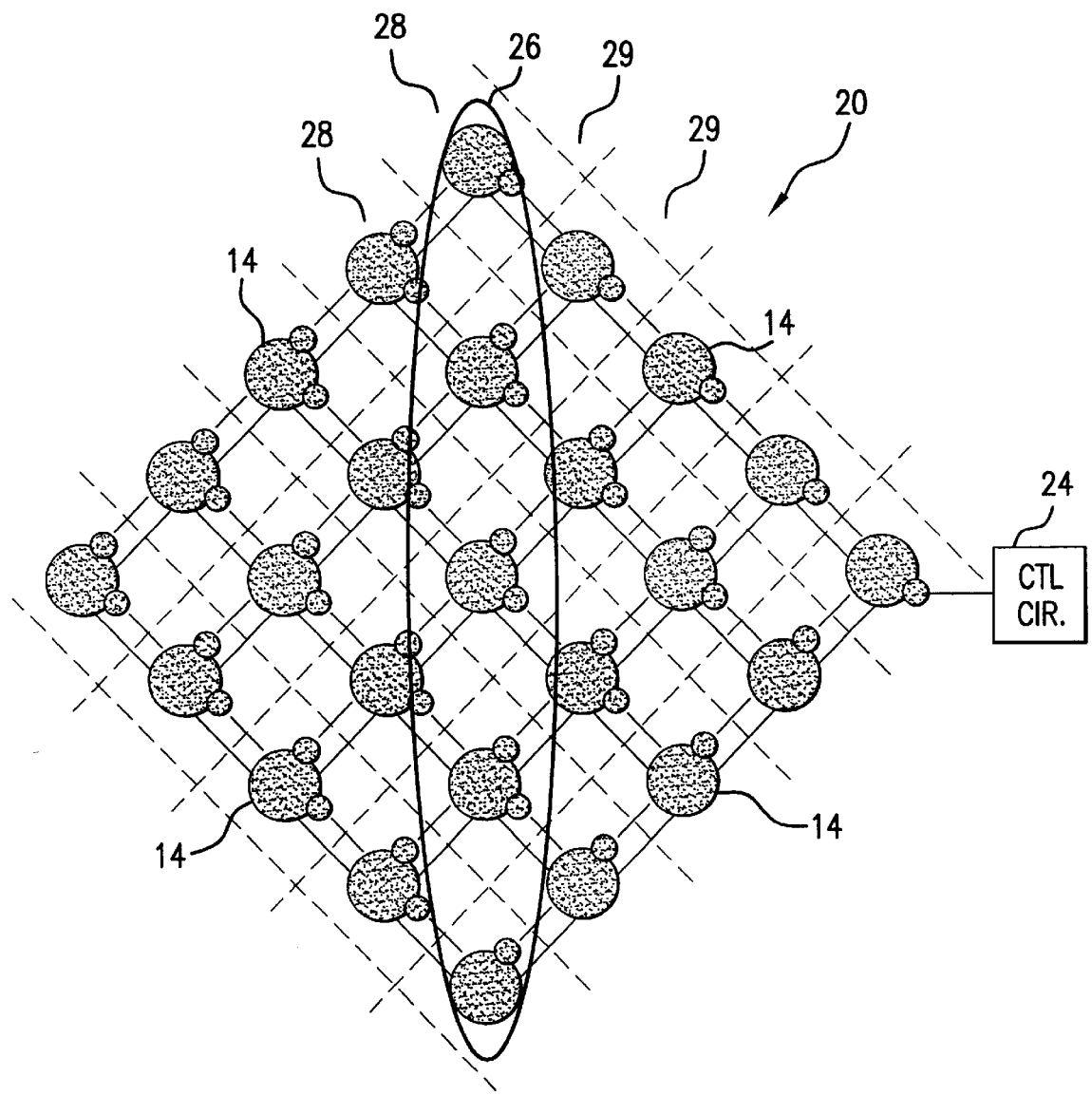

FIG. 3C shows the 2D C-element array 20 of FIG. 3B with broken lines superimposed thereon to illustrate another possible description of array 20 in terms of columns 28 and rows 29. In FIG. 3C, five elements in a diagonal of array 20 are in phase.

With respect to FIGS. 3A–3C, it may be observed that 2D C-element array 20 includes at least a first C-element 300 and a second C-element 301, wherein an output of C-element 300 is coupled via a non-inverting connector 15 to an input of C-element 301, and an output of C-element 301 is coupled via an inverting connector 17 to an input of C-element 300. 2D C-element array 20 further includes at least a third C-element 302 and a fourth C-element 303, wherein an output of C-element 302 is coupled via a non-inverting connector 15 to an input of C-element 303, and an output of C-element 303 is coupled via an inverting connector 17 to an input of C-element 302. Moreover, an output of C-element 302 is coupled to an input of C-element 300 via a non-inverting connector 15, and an output of C-element 300 is coupled to an input of C-element 302 via an inverting connector 17. Further, an output of C-element 303 is coupled to an input of C-element 301 via a non-inverting connector 15, and an output of C-element 301 is coupled to an input of C-element 303 via an inverting connector 17.

The periodic waveform represented by area 26 may be "free running" or, alternatively, driven by a control circuit 24, such as a clock generator. "Free running" means that if the array is suitably provided with feedback, once initiated the waveform oscillates at the array's natural frequency and does not require a driver such as a clock generator. Rather, the waveform has a frequency which is determined by the delay characteristic $t_C$ of the loops in the array.

On the other hand, as noted above, array 20 could be coupled to a control circuit 24, such as a clock generator. In this case, the wave represented by area 26 would not be free running; instead, its frequency would be controlled by the control circuit 24. Since, as described above, the natural frequency of the oscillation in array 20 is governed by the slowest loop therein, it may be seen that to control the frequency, the control circuit 24 should input a frequency slower than or equal to the natural frequency of oscillation. Advantageously, control circuit 24 could be configured to input a driving frequency to the array wherein the driving frequency was dependent on voltage and/or temperature, in order to facilitate analog changes in the frequency of a periodic waveform propagated by the array, as described in greater detail hereinafter. As long as the driving frequency supplied by control circuit 24 was slower than or equal to the natural frequency of the array, the frequency of the waveform would be equal to the driving frequency. Control circuit 24 could also be configurable to track usage; i.e., it may be made to generate a driving frequency responsive to whether a processor is executing a computation-intensive application such as a video game, or a less demanding task such as word processing. Control circuit 24 may be implemented in any of a number of forms. Control circuit 24 could be, for example, a clock generator implemented as a standalone VCO. Other possible implementations that are capable of tracking voltage (the voltage could be, for example, a supply voltage $V_{CC}$ of a semiconductor chip) and temperature are readily contemplated by persons skilled in the art.

FIG. 4 illustrates a 2D C-element array 30 in accordance with one embodiment of the present invention, illustrating on a larger scale than in FIG. 3 the propagation of a periodic waveform across a 2D C-element array 30. Due to the larger scale of FIG. 3, loops 19 are represented by single lines. The darker C-elements 32 could represent, for example, C-elements having a logic value "11", and the lighter C-elements 34 could represent, for example, C-elements having a logic value "0". Thus, FIG. 4 could represent a snapshot of a periodic waveform which causes the all the C-elements of a given column of the array to take on a logic "1" value at every fourth time interval, where the time interval depends on how the period of the waveform is defined. For example, the period of the waveform shown in FIG. 4 could be defined as two time intervals each having a duration of 0.25 nanoseconds where the waveform has a logic "1" value, followed by two time intervals each having a duration of 0.25 nanoseconds, where the waveform has a logic "0" value. This would correspond to a frequency of 1 GHz for the waveform.

It may be appreciated that as the waveform propagates across the array 30, a selected C-element of the array 30 could, for example, be used locally as a clock. More particularly, the array 30 could be formed so as to distribute C-elements in a pre-determined pattern throughout an area of a semiconductor chip. Logic circuitry formed in the chip, such as a processor or a memory array, could use a local, i.e., nearby, C-element as a driver or clock. Such a use of selected C-elements could be particularly advantageous for high speed applications, for example, when the logic circuitry driven by the selected C-element is a processor. Accordingly, FIG. 4 further illustrates, by way of example only, a selected C-element 31 providing a localized clock input to a processor 39. On the other hand, other C-elements in the array 30 might not necessarily be used to drive other circuitry in the chip, but would instead only constitute part of the path for propagating a wave across the array 30.

A region of a semiconductor chip containing logic circuitry driven by a local C-element may be referred to herein as a "local clock domain." It may be appreciated in view of the foregoing that a 2D C-element array formed in a semiconductor chip may viewed as constituting a "communication fabric" that enables synchronous operation of all local clock domains whether free running or driven by some kind of control circuit. In addition, all skew and jitter are local in the 2D C-element array.

It may further be appreciated that source synchronous clocking is facilitated according to embodiments of the invention because each C-element of a 2D array is dependent on a neighboring C-element to receive a clock edge. That is, because a clock edge travels in a stepwise fashion along a communication path from C-element to C-element, it is easy to transfer data between C-elements synchronously with the clock edge. Source synchronous clocking is advantageous, for example, because when the data travels with the clock, guard-banding issues for data capture are simplified.

Figure 5A:
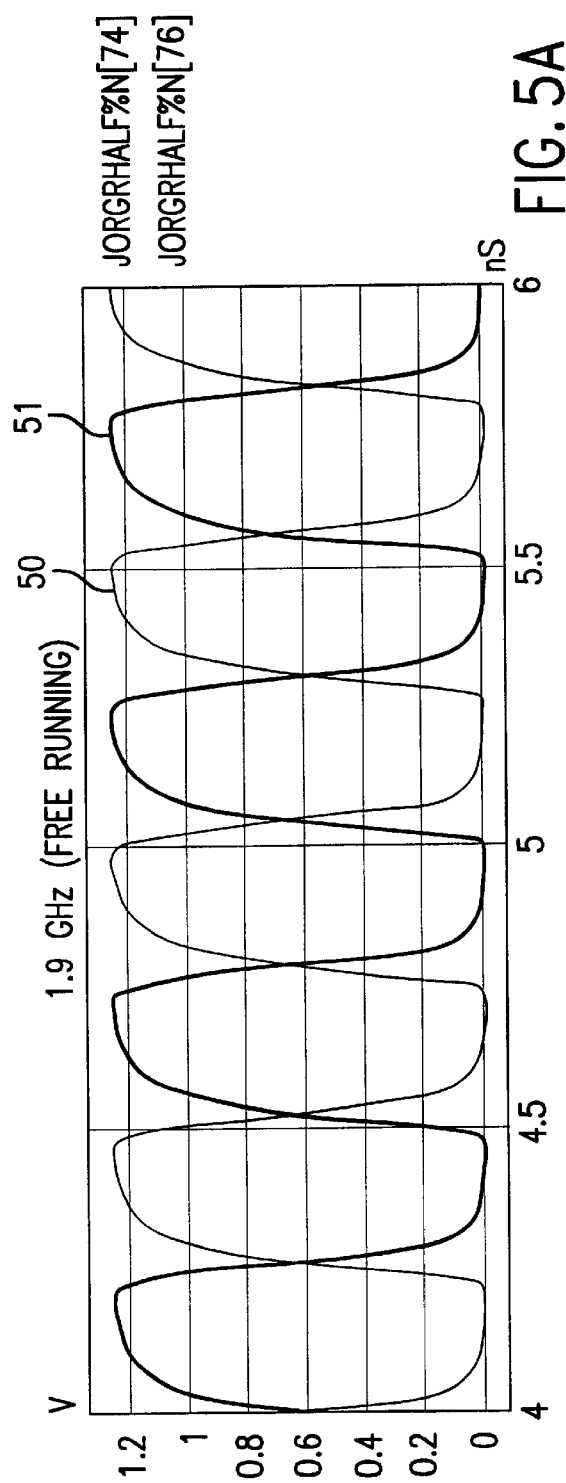
FIGS. 5A and 5B are diagrams of pulse trains in a 2D C-element array in accordance with one embodiment of the present invention.

One of the advantages of the present invention is that a 2D C-element array is able to run at 50% duty cycle when free-running and when devices are properly sized. A duty cycle is defined as the ratio of the average value of the signal to the peak pulse value and represents the percentage of time that the pulse is present. FIG. 5A shows the output, according to one commercially available simulation program, at two C-elements in a 2D C-element array as described in the foregoing. Waveform 50 corresponds to the output of a first C-element and waveform 51 corresponds to the output of a second C-element. Waveforms 50 and 51 represent outputs of an array that is free-running. As can be seen, the duty cycle of waveforms 50 and 51 is substantially 50%.

Figure 5B:
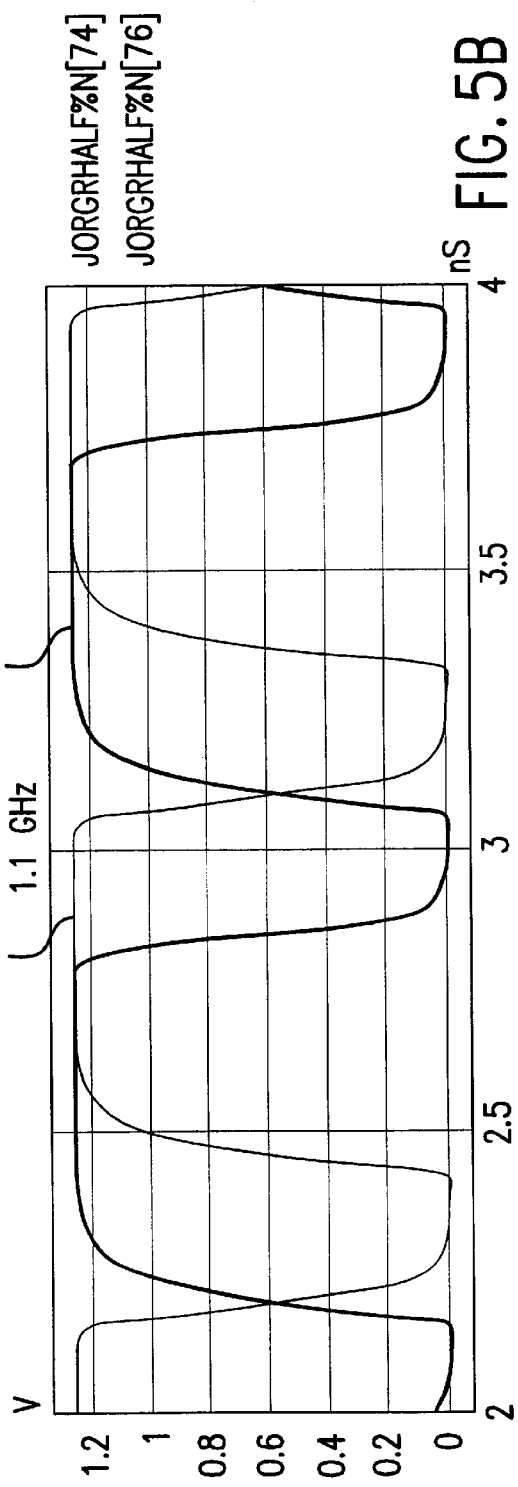

FIG. 5B, by contrast, shows the output of the same two C-elements when the array is being controlled by a control circuit to run at a slower frequency. Waveform 52 corresponds to the C-element represented by waveform 50 in FIG. 5A, and waveform 53 corresponds to the C-element represented by waveform 51 in FIG. 5B. The duty cycle of waveforms 52 and 53 is not 50%. However, control circuitry could be designed to cause the duty cycle to be substantially 50% when the array is not free running.

Figure 6:
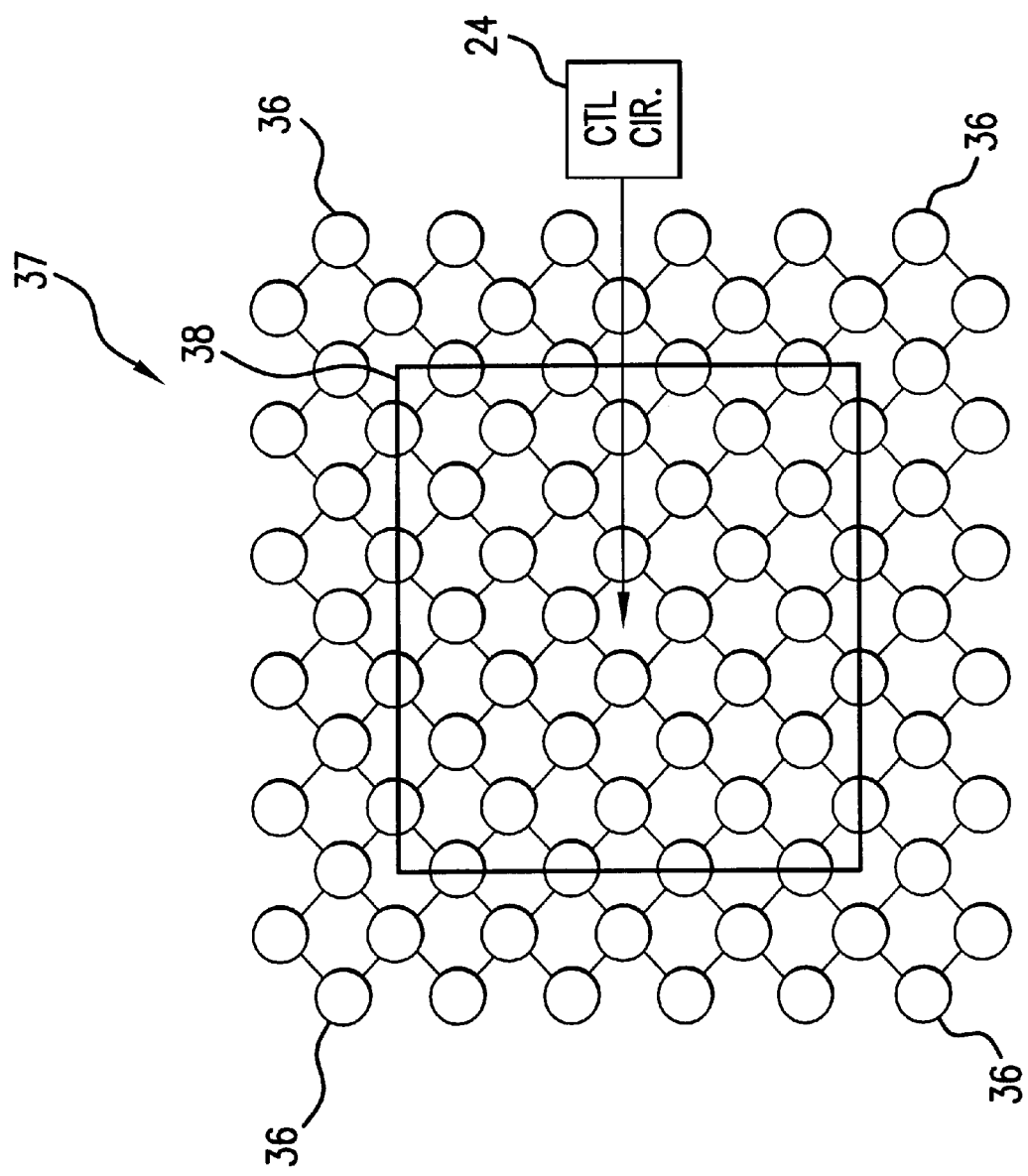
FIG. 6 illustrates a 2D C-element array for a semiconductor chip in accordance with one embodiment of the present invention.

FIG. 6 illustrates a 2D C-element array 37 for a semiconductor chip in accordance with one embodiment of the present invention. 2D C-element array 37 includes a plurality of C-elements 36 arranged so as to constitute a communication fabric for propagating signals across a semiconductor chip. In addition, FIG. 6 illustrates an example of how a propagation pattern and directionality of a periodic waveform across an array may be controlled by placement of signals from control circuit 24. In FIG. 6, control circuit 24 sends signals to a C-element 36 that is centrally located in array 37, causing a periodic waveform represented by a wave front 38 to be propagated radially, i.e., in four directions from an inner area of array 37 to an outer area thereof. By contrast, in FIG. 4 for example, control circuit 24 sends signals to a C-element that is located on an edge of array 30, causing a waveform to propagated from the right to the left of the figure. As described in connection with FIG. 4, the pulse train of the waveform in FIG. 6 could be used as driver signals or clocks in local clock domains of the chip and may be free running or controlled by a control circuit.

Figure 7:
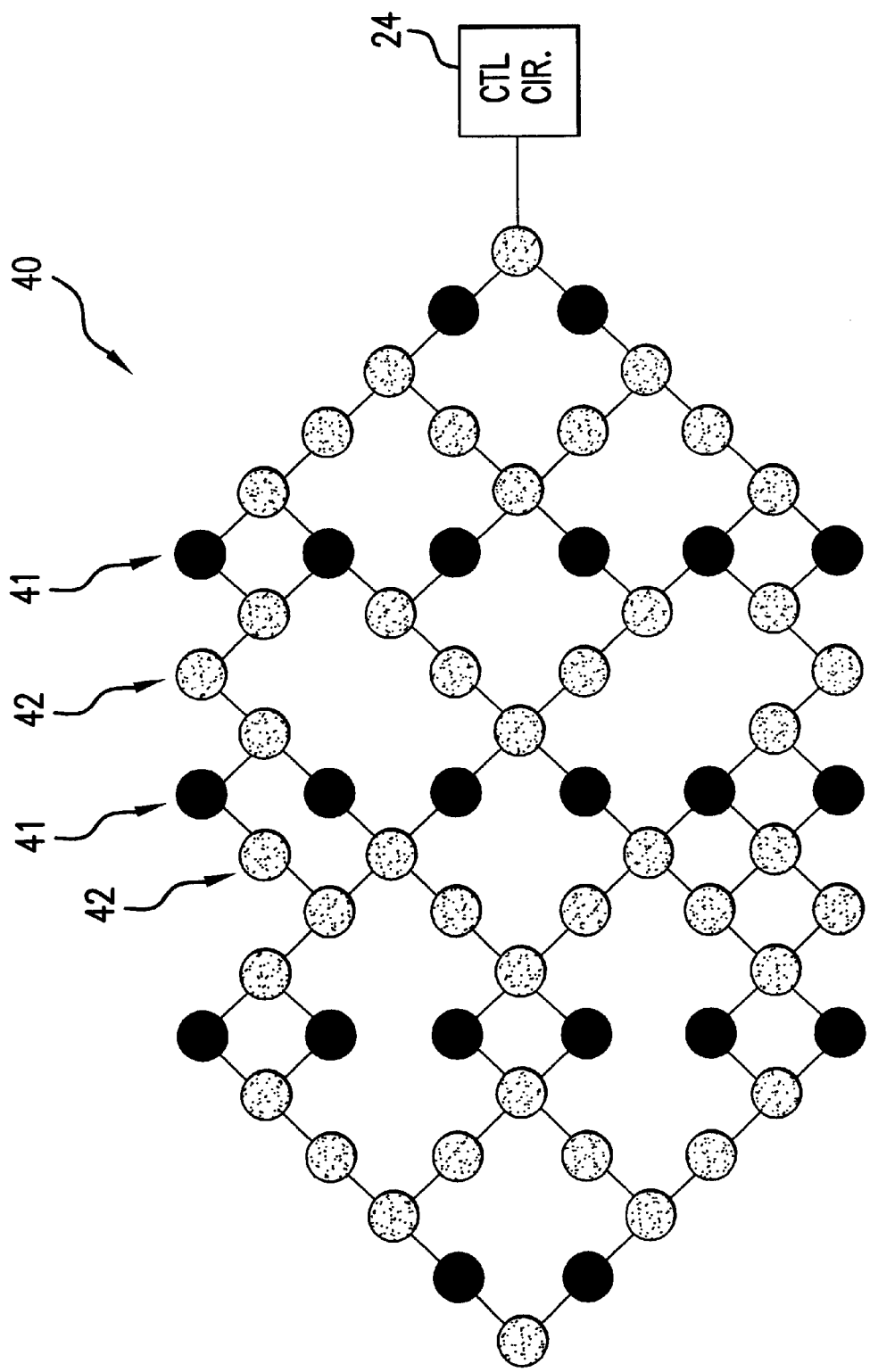
FIG. 7 illustrates a sparse 2D C-element array for a semiconductor chip in accordance with one embodiment of the present invention.

FIG. 7 illustrates another possible pattern for distributing C-elements in an array. It is noted that, in general, an array in at least one commonly-recognized sense comprises rows and columns of array elements, and an array element may defined in terms of which row and column of the array it occupies. Other terms which are often used as equivalents of "array" in the foregoing sense include "matrix," "grid" and "lattice." It is further noted that not every position in an array definable by a row and column need be occupied. Arrays in which not every row and column position is occupied by an array element may sometimes be referred to as "sparse." For example, in mathematics a sparse matrix is one that is predominantly populated by zeroes.

In FIG. 7, a 2D C-element array 40 may be viewed as "sparse" in the foregoing sense in that the constituent C-elements of array 40 are more scattered or thinly distributed than in the arrays shown in FIGS. 3, 4 and 6. Along the lines described above in connection with FIG. 4, columns of darker C-elements 41 could represent C-elements having a logic "1" value, while columns of lighter C-elements 42 could represent C-elements having a logic "0" value, in a snapshot of a waveform as it propagates across the array 40. By distributing C-elements more sparsely as shown in FIG. 7, power may be conserved as compared to a more dense array as shown in FIG. 4. Clearly, any number of distribution patterns and configurations of C-elements are possible for an array, and are not limited to the examples shown and described herein.

As noted earlier, an advantage of the present invention according to embodiments is that a 2D C-element array enables analog adjustments in frequency. If a 2D C-element array is free running, or is controlled by a control circuit that tracks voltage (for example, a semiconductor chip supply voltage $V_{CC}$) and temperature, analog adjustments in the frequency of a waveform propagated by the array are possible. For example, assume the array is free running. Because the transition speed of each C-element in the array is affected by its respective input voltage, including that of the slowest C-element, which governs the natural frequency, the natural frequency will change with changes in voltage applied to the overall array. More particularly, higher voltage applied the overall array will cause state transitions in the C-elements to take place more quickly, and lower voltage will cause state transitions in the C-elements to take place more slowly. Thus, if the array is free running, and the voltage applied to the array is lowered, the frequency of the waveform will naturally become lower. Conversely, if the voltage applied to the array is raised, the frequency of the waveform will naturally become higher.

Similarly, transition speed of individual C-elements, including the slowest C-element, is affected by temperature. Thus, if the temperature of the array becomes higher, the frequency of the waveform will naturally become lower, and if the temperature of the array becomes lower, the frequency of the waveform will naturally become higher. Therefore, the array is self-regulating when free-running. Alternatively, the array could be controlled by a control circuit that generates a frequency that is responsive to voltage and temperature, but that is slower than the natural frequency of the array, and the same self-regulating properties would be achieved.

A further advantage of a 2D C-element array as described above is that it can reduce EMI (electromagnetic interference) noise and $V_{CC}$ noise as compared with known approaches to clocking. For example, in clocking systems that use a PLL, clocking is typically "isochronous," meaning that an entire chip is driven by a given clock pulse at the same time. This tends to cause large EMI spikes of radiation. By contrast, a 2D C-element array, when configured to track $V_{CC}$ and temperature as described above, can force subtle phase shifts across the array which will dramatically reduce EMI spike size.

Additionally, as noted above, a PLL is limited because it must run at a frequency determined by an operator; thus, a PLL is unable to rapidly respond to changes in frequency. The PLL transmits a frequency that is a fixed ratio of the frequency of the clock. In order to change the clock frequency, a ratio control circuit must be implemented. In contrast, because it is able to make analog adjustments in frequency, a 2D C-element array according to embodiments described herein provides for matching the clocking frequency to the processing power required by a specific application in a microprocessor. This ability also allows the processor to reduce power consumption when maximum processing power is not needed.

FIG. 8 shows another known embodiment of a C-element 80. The C-element 80 has four inputs IN1, IN2, IN3 and IN4. The C-element 80 also has a reset input (the reset input is inverted, as indicated by the # sign), and an inverted output OUT#. The C-element 80 may also represented as by circle having four inputs IN1–IN4, a reset# input and an output OUT# as further shown in FIG. 8. The operation of such a C-element is well known and is not discussed in detail herein.

According to embodiments of the invention, a C-element 80 as shown in FIG. 8 may be used in an array 90 as shown in FIG. 9. The reset# input 91 to the array 90 may be used to place the array into a determinate state, so that a predictable, regular periodic waveform may be subsequently established in the array. The reset# input 91 could, for example, be provided by a control circuit such as control circuit 24.

More particularly, upon such events as initial powering-up of the array 90, electrical signals may be propagated in the array in a random, indeterminate fashion. By applying a logic "0" to the reset# input 91 to the array, the outputs of the four-input C-elements 80 connected to the reset# input 91 will be caused to assume a logic "0" value. Therefore, both inputs to the two-input C-elements 92 neighboring the four-input C-elements 80 will be caused to assume a logic "0" value, forcing the outputs of the two-input C-elements 92 to assume a logic "0" value. Thus, by appropriately applying the reset# input 91, the entire array 90 can be placed into a determinate state, i.e., in the present example, a state wherein all the outputs of the constituent C-elements of the array have a logic "0" value. Thereafter, the reset# input 91 may be released, causing all of the four-input C-elements 80 to assume a logic "1" value, the two-input C-elements 92 to change state in response, and thereby initiating a predictable, regular oscillation in the array 90. The oscillation may be controlled by a control circuit 24 that tracks $V_{CC}$, temperature and usage, or may be free running.

It is observed that the principles outlined above with respect to 2D C-element arrays could be readily applied to 3D (three-dimensional) or higher-order arrays.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A two-dimensional C-element array, comprising:
   a plurality of C-elements arranged in rows and columns; and
   a plurality of connections formed between Pairs of said C-elements to propagate a periodic waveform across said array;
   wherein said array includes feedback to cause said waveform to be free-running.

2. The two-dimensional C-element array of claim 1, wherein said connections comprise a non-inverting connector and an inverting connector to connect each of said C-elements to another of said C-elements.

3. The two-dimensional C-element array of claim 1, wherein said array is connected to a control circuit to control a frequency of said waveform.

4. The two-dimensional C-element of claim 3, wherein said control circuit is responsive to at least one of voltage, temperature and usage.

5. A two-dimensional C-element array, comprising:
   at least a first C-element and a second C-element, wherein an output of said first C-element is coupled via a non-inverting connector to an input of said second C-element, and an output of said second C-element is coupled via an inverting connector to an input of said first C-element; and
   at least a third C-element and a fourth C-element, wherein an output of said third C-element is coupled via a non-inverting connector to an input of said fourth C-element, and an output of said fourth C-element is coupled via an inverting connector to an input of said third C-element; and further wherein
   an output of said third C-element is coupled to an input of said first C-element via a non-inverting connector, and an output of said first C-element is coupled to an input of said third C-element via an inverting connector; and
   an output of said fourth C-element is coupled to an input of said second C-element via a non-inverting connector, and an output of said second C-element is coupled to an input of said fourth C-element via an inverting connector.

6. The two-dimensional C-element array of claim 5, wherein each of loops formed by said first, second, third and fourth C-elements and associated non-inverting and inverting connectors has matching delay characteristics.

7. The two-dimensional C-element array of claim 5, wherein said array includes feedback to cause said a periodic waveform propagated by said array to be free-running.

8. The two-dimensional C-element array of claim 5, wherein said array is connected to a control circuit to control a frequency of said waveform.

9. The two-dimensional C-element array of claim 8, wherein said control circuit generates a driving frequency that is responsive to at least one of voltage, temperature and usage.

10. The two-dimensional C-element array of claim 5, wherein said array is sparse.

11. The two-dimensional C-element array of claim 5, wherein said array includes a reset input to place said array into a determinate state.

12. A semiconductor device comprising:

logic circuitry; and a two-dimensional C-element array configured to propagate a periodic waveform;

wherein a selected C-element of said array provides a clock input to said logic circuitry; and wherein said array includes a reset input to place said array into a determinate state.

13. The semiconductor device of claim 12, wherein said logic circuitry comprises a processor.

14. A system comprising:

a two-dimensional C-element array comprising a plurality of connections formed between Pairs of C-elements, to propagate a periodic waveform across said array; and a control circuit coupled to said array to control a frequency of said waveform;

wherein said control circuit is configured to input a control frequency that is slower than a natural frequency of said waveform.

15. The system of claim 14, wherein said control circuit is responsive to at least one of voltage, temperature and usage.

16. The system of claim 14, wherein said control circuit is configured to input a reset signal to said array to place said array into a determinate state.

* * * * *